United States Patent
Shin et al.

(10) Patent No.: US 9,754,698 B2
(45) Date of Patent: Sep. 5, 2017

(54) TRANSPARENT CONDUCTOR, METHOD FOR PREPARING THE SAME, AND OPTICAL DISPLAY INCLUDING THE SAME

(71) Applicant: SAMSUNG SDI CO., LTD., Yongin-si, Gyeonggi-do (KR)

(72) Inventors: Dong Myeong Shin, Suwon-si (KR); Young Kwon Koo, Suwon-si (KR); Oh Hyeon Hwang, Suwon-si (KR); Kyoung Ku Kang, Suwon-si (KR); Do Young Kim, Suwon-si (KR); Dae Seob Shim, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 245 days.

(21) Appl. No.: 14/523,205

(22) Filed: Oct. 24, 2014

(65) Prior Publication Data
US 2015/0118508 A1      Apr. 30, 2015

(30) Foreign Application Priority Data

Oct. 24, 2013  (KR) .................. 10-2013-0127348
Oct. 20, 2014  (KR) .................. 10-2014-0141649

(51) Int. Cl.
| | |
|---|---|
| *H01B 1/22* | (2006.01) |
| *H05K 1/02* | (2006.01) |
| *H05K 1/03* | (2006.01) |
| *H01B 13/30* | (2006.01) |
| *H05K 1/09* | (2006.01) |

(52) U.S. Cl.
CPC ............. *H01B 1/22* (2013.01); *H01B 13/30* (2013.01); *H05K 1/097* (2013.01); *H05K 2201/0108* (2013.01); *H05K 2201/026* (2013.01); *Y10T 428/31678* (2015.04)

(58) Field of Classification Search
None
See application file for complete search history.

(56) References Cited

U.S. PATENT DOCUMENTS

| | | | |
|---|---|---|---|
| 2004/0263483 A1* | 12/2004 | Aufderheide | G06F 3/03545 345/173 |
| 2006/0103632 A1* | 5/2006 | Bourdelais | G06F 3/045 345/173 |

(Continued)

FOREIGN PATENT DOCUMENTS

KR    10-2012-0053724 A    5/2012

*Primary Examiner* — Alexandre Ferre
(74) *Attorney, Agent, or Firm* — Lee & Morse, P.C.

(57) ABSTRACT

A transparent conductor, a method for preparing the same, and an optical display including the same, the transparent conductor including a base layer; and a conductive layer on the base layer, the conductive layer including metal nanowires and a matrix, wherein the transparent conductor has a transmissive b* value of about 1.5 or less, and the matrix is prepared from a matrix composition including a tri-functional monomer and one of a penta-functional monomer or a hexa-functional monomer a base layer; and a conductive layer formed on the base layer and including metal nanowires and a matrix, wherein the transparent conductor has a transmissive b* value of about 1.5 or less, and the matrix is formed of a composition including a penta- or hexa-functional monomer and a tri-functional monomer.

19 Claims, 3 Drawing Sheets

(56) References Cited

U.S. PATENT DOCUMENTS

| | | | |
|---|---|---|---|
| 2006/0128826 A1* | 6/2006 | Ellison | B82Y 30/00 522/127 |
| 2007/0074316 A1* | 3/2007 | Alden | B82Y 30/00 257/784 |
| 2010/0264378 A1* | 10/2010 | Naoi | C08F 220/28 252/514 |
| 2010/0273100 A1* | 10/2010 | Yu | G03G 5/047 430/58.05 |

* cited by examiner

TRANSPARENT CONDUCTOR, METHOD FOR PREPARING THE SAME, AND OPTICAL DISPLAY INCLUDING THE SAME

CROSS-REFERENCE TO RELATED APPLICATIONS

Korean Patent Application No. 10-2013-0127348, filed on Oct. 24, 2013 in the Korean Intellectual Property Office, and Korean Patent Application No. 10-2014-0141649, filed on Oct. 20, 2014 in the Korean Intellectual Property Office, and entitled: "Transparent Conductor, Method for Preparing the Same and Optical Display Comprising the Same," are incorporated by reference herein in their entirety.

BACKGROUND

1. Field

Embodiments relate to a transparent conductor, a method for preparing the same, and an optical display including the same.

2. Description of the Related Art

Transparent conductors may be used in various fields, e.g., touchscreen panels included in displays, flexible displays and the like. The transparent conductors may exhibit good fundamental properties such as transparency, sheet resistance, or the like, and may have flexural properties as an application range thereof expands to flexible displays.

SUMMARY

Embodiments are directed to a transparent conductor, a method for preparing the same, and an optical display including the same.

The embodiments may be realized by providing a transparent conductor including a base layer; and a conductive layer on the base layer, the conductive layer including metal nanowires and a matrix, wherein the transparent conductor has a transmissive b* value of about 1.5 or less, and the matrix is prepared from a matrix composition including a tri-functional monomer and one of a penta-functional monomer or a hexa-functional monomer a base layer; and a conductive layer formed on the base layer and including metal nanowires and a matrix, wherein the transparent conductor has a transmissive b* value of about 1.5 or less, and the matrix is formed of a composition including a penta- or hexa-functional monomer and a tri-functional monomer.

The tri-functional monomer may include a (meth)acrylate-based monomer.

The tri-functional monomer may include a (meth)acrylate-based monomer modified with an alkoxy group.

The transparent conductor may have a resistance variation rate of about 10% or less, as represented by the following equation:

Resistance variation rate=|b−a|/a×100, wherein, "a" represents an initial sheet resistance of a sample formed by stacking a 125 μm thick transparent adhesive film and a 100 μm thick PET film sequentially on the transparent conductor, and "b" represents a sheet resistance of the sample after being left under conditions of 85° C. and 85% RH for 240 hours.

The matrix composition may further include at least one of an initiator, an adhesion promoter, or an antioxidant.

The matrix composition may include the adhesion promoter, and the adhesion promoter may be present in the matrix composition in an amount of about 1 wt % to about 15 wt %, in terms of solid content.

The matrix composition may include the antioxidant, and the antioxidant may be present in the matrix composition in an amount of about 0.01 wt % to about 5 wt %, in terms of solid content.

The matrix composition may include about 50 wt % to about 70 wt % of the hexa-functional monomer or the penta-functional monomer, about 10 wt % to about 30 wt % of the tri-functional monomer, about 1 wt % to about 15 wt % of the initiator, about 1 wt % to about 15 wt % of the adhesion promoter, and about 0.01 wt % to about 5 wt % of the antioxidant, all amounts being in terms of solid content.

The matrix composition may include the adhesion promoter, and the adhesion promoter may include at least one of a silane coupling agent or a bi-functional monomer.

The matrix composition may include the antioxidant, and the antioxidant may include a hindered amine light stabilizer (HALS)-based antioxidant and a phosphorus-based antioxidant.

The matrix composition may include the antioxidant, and the antioxidant may include a triazole-based antioxidant, a phenol-based antioxidant, and a phosphorus-based antioxidant.

The matrix composition may include the antioxidant, and the antioxidant may include a triazine-based antioxidant, a phenol-based antioxidant, and a phosphorus-based antioxidant.

The metal nanowires may include silver nanowires.

The transparent conductor may further include, on an upper or lower surface of the base layer, at least one of a hard coating layer, an anticorrosive layer, an anti-glare coating layer, an adhesion enhancing layer, or an oligomer elution preventive layer.

The conductive layer may be a patterned conductive layer.

The embodiments may be realized by providing a method for preparing a transparent conductor, the method including forming a metal nanowire network layer on a base layer; and forming a conductive layer on the metal nanowire network layer using a matrix composition, the matrix composition including a tri-functional monomer, an adhesion promoter, an antioxidant, an initiator, and one of a penta-functional monomer or a hexa-functional monomer.

The embodiments may be realized by providing an optical display including the transparent conductor according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
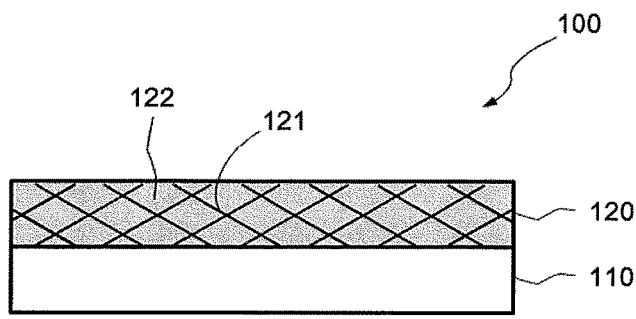
FIG. 1a illustrates a sectional view of a transparent conductor according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, directional terms such as "upper side" and "lower side" are defined with reference to the accompanying drawings. Thus, it will be understood that an "upper side" may be used interchangeably with a "lower side". The term "(meth)acrylate" may refer to acrylates and/or methacrylates.

Herein, the "transmissive b* value" of a transparent conductor may be measured using a colorimeter CM6000D (Konica Minolta Co., Ltd.) at a wavelength of about 400 nm to about 700 nm. Specifically, the transparent conductor may include a polycarbonate base film (thickness: about 50 μm to about 125 μm) and a conductive layer (thickness: about 10 nm to about 1 μm) stacked on the base film. The conductive layer may include, e.g., metal nanowires and a matrix. Here, it should be understood that transmissive b* values measured by changing the material and thickness of the base film, the thickness of the conductive layer, and the wavelength may also fall within the scope of the embodiments.

As used herein, the term "reliability" refers to resistance variation rate, as measured on a transparent conductor, to which a thick transparent adhesive film (Optically Clear Adhesives 8215, 3M) of about 50 μm to about 125 μm thickness and a polyethylene terephthalate (PET) film of about 38 μm to about 125 μm thickness are attached, after being left under conditions of about 85° C. and about 85% relative humidity (RH) for about 240 hours. When the conductor has a resistance variation rate of about 10% or less, e.g., about 1% to about 10%, the conductor is determined to have reliability.

A transparent conductor according to an embodiment may include, e.g., a base layer and a conductive layer on the base layer. The conductive layer may include, e.g., metal nanowires and a matrix. The matrix may be formed of or prepared from a matrix composition including a tri-functional monomer and one of a penta-functional monomer or a hexa-functional monomer. The transparent conductor according to an embodiment may exhibit good optical properties including transmittance, haze, or the like, and may have low sheet resistance and improved reliability and durability.

Next, a transparent conductor according to an embodiment will be described with reference to FIG. 1.

Referring to FIG. 1a, a transparent conductor 100 according to an embodiment may include a base layer 110 and a conductive layer 120 on the base layer 110. The conductive layer 120 may include, e.g., metal nanowires 121 and a matrix 122. In an implementation, the transparent conductor 100 may have a transmissive b* value of about 1.5 or less. The matrix 122 may be formed of or prepared from a matrix composition that includes, e.g., a tri-functional monomer and one of a penta-functional monomer or a hexa-functional monomer. The matrix 122 may be cured by UV irradiation to help increase transmittance of the transparent conductor while reducing the transmissive b* value of the transparent conductor, thereby minimizing a phenomenon that the conductive layer looks yellow, while also improving reliability of the conductive layer.

In an implementation, the transparent conductor 100 may have a transmissive b* value of about 1.5 or less, e.g., about 0.50 to about 1.50 or about 1.00 to about 1.3. Within this range, the transparent conductor 100 may have high transmittance and a low resistance variation rate, and may be used as a transparent electrode film after patterning. The transparent conductor 100 according to an embodiment may exhibit good properties of suitable transparent conductors, e.g., durability, chemical resistance, solvent resistance, or the like, due to the matrix 122.

The base layer 110 may be a transparent film, and may have a transmittance of about 85% to about 100%, e.g., about 90% to about 99%, at a wavelength of about 550 nm. In an implementation, the base layer 110 may include, e.g., polycarbonates, cyclic olefin polymers, polyesters such as polyethylene terephthalate (PET), polyethylene naphthalate, or the like, polyolefin, polysulfone, polyimide, silicone, polystyrene, polyacryl, polyvinyl chloride, or combinations thereof. The base layer 110 may be composed of a single layer or a stacked structure of at least two resin films. The base layer 110 may have a thickness of about 10 μm to about 200 μm, e.g., about 50 μm to about 150 μm. Within this range, the base layer may be used for displays.

The conductive layer 120 may include the metal nanowires 121 and the matrix 122. The metal nanowires 121 may form a network, thereby securing conductivity, good flexibility, and bendability.

The metal nanowires 121 may exhibit better dispensability than metal nanoparticles, e.g., due to the shape of nanowires. The metal nanowires 121 may significantly reduce sheet resistance of the transparent conductive film due to, e.g., a difference between the particle shape and the nanowire shape. The metal nanowires 121 may have an ultrafine wire shape having a specific cross-section. In an implementation, a ratio of length (L) to cross-sectional diameter (d) of the metal nanowires 121 (L/d, aspect ratio) may be, e.g., about 10 to about 2,000. Within this range, the transparent conductor may realize a highly conductive network even at a low concentration of nanowires, and may exhibit reduced sheet resistance. In an implementation, the metal nanowires may have an aspect ratio of about 500 to about 1,000, e.g., about 500 to about 700. The metal nanowires 121 may have a cross-sectional diameter (d) of, e.g., about 100 nm or less. Within this range, the transparent conductor 100 exhibiting high conductivity and low sheet resistance may be realized by securing a high L/d. In an implementation, the metal nanowires 121 may have a cross-sectional diameter (d) of about 30 nm to about 100 nm, e.g., about 60 nm to about 100 nm. The metal nanowires 121 may have a length (L) of about 20 μm or more. Within this range, a conductive film exhibiting high conductivity and low sheet resistance may be realized by securing a high L/d. In an implementation, the metal nanowires 121 may have a length (L) of, e.g., about 20 μm to about 50 μm. The metal nanowires 121 may include nanowires formed of or including a suitable metal. In an implementation, the metal nanowires may include, e.g., silver nanowires, copper nanowires, gold nanowires, or mixtures thereof. In an implementation, the metal nanowires may be silver nanowires or mixtures including the silver nanowires.

The metal nanowires 121 may be prepared by a suitable method or may be commercially available. In an implementation, the metal nanowires may be prepared through reduction of a metal salt (e.g., silver nitrate, $AgNO_3$) in the presence of a polyol and poly(vinyl pyrrolidone). Alternatively, the metal nanowires may be a commercially available product manufactured by Cambrios Co., Ltd. (e.g., ClearOhm Ink, a metal nanowire-containing solution). The metal nanowires 121 may be present in an amount of about 13 wt % or more, e.g., about 13 wt % to about 50 wt %, in the conductive layer 120. Within this range, the transparent conductor may secure sufficient conductivity and the metal nanowires may form the conductive network.

For easy coating onto the base layer 110 and adhesion thereto, the metal nanowires 121 may be dispersed in a liquid. As used herein, a liquid composition in which the metal nanowires are dispersed is referred to as a "metal nanowire composition". The metal nanowire composition may include additives and a binder for dispersion of the metal nanowires. The binder may include, e.g., carboxymethylcellulose (CMC), 2-hydroxyethylcellulose (HEC), hydroxypropyl methylcellulose (HPMC), methylcellulose (MC), polyvinyl alcohol (PVA), tripropylene glycol (TPG), polyvinylpyrrolidone, xanthan gum (XG), ethoxylates, alkoxylates, ethylene oxide, propylene oxide, or copolymers thereof.

The metal nanowires 121 may be impregnated into the matrix 122. The metal nanowires 121 may be dispersed or buried in the matrix 122, or may be partially exposed on the surface of the conductive layer 120. The matrix 122 may help prevent oxidation and abrasion of the metal nanowires 121, which may be exposed from or on the conductive layer 120, and may help impart adhesion between the conductive layer 120 and the base layer 110, thereby improving optical properties, chemical resistance, and solvent resistance of the transparent conductive film.

The matrix 122 may be formed of or prepared from a matrix composition including a tri-functional monomer and one of a penta-functional monomer or a hexa-functional monomer. The penta-functional monomer or hexa-functional monomer may refer to a penta-functional monomer or hexa-functional monomer (meth)acrylate monomer having a (meth)acrylate group, e.g., a penta-functional monomer or hexa-functional monomer of a $C_3$ to $C_{20}$ polyhydric alcohol. In an implementation, the penta-functional monomer or hexa-functional monomer may include a urethane-group free penta-functional monomer or hexa-functional monomer, whereby cured products may be densely stacked in a network structure of the metal nanowires 121 and adhesion to the base layer 110 may be enhanced. In an implementation, the penta-functional monomer or hexa-functional monomer may include, e.g., dipentaerythritol penta(meth)acrylate, dipentaerythritol hexa(meth)acrylate, caprolactone-modified dipentaerythritol penta(meth)acrylate, or caprolactone-modified dipentaerythritol hexa(meth)acrylate.

The tri-functional monomer may be a tri-functional (meth)acrylate monomer having a (meth)acrylate group. The tri-functional monomer may be a urethane-group free tri-functional monomer lacking a urethane group. For example, cured products may be densely stacked in a network structure of the metal nanowires 121, and adhesion to the base layer 110 may be enhanced. The tri-functional monomer may include, e.g., tri-functional monomers of $C_3$ to $C_{20}$ polyhydric alcohols or tri-functional monomers of $C_3$ to $C_{20}$ polyhydric alcohols modified with an alkoxy group. Examples of the tri-functional monomers of $C_3$ to $C_{20}$ polyhydric alcohols may include trimethylolpropane tri(meth)acrylate, glycerol tri(meth)acrylate, pentaerythritol tri(meth)acrylate, and dipentaerythritol tri(meth)acrylate. The tri-functional monomers of $C_3$ to $C_{20}$ polyhydric alcohols modified with the alkoxy group may help further improve transmittance and reliability of the transparent conductor, as compared with a tri-functional monomer that does not include the alkoxy group, and may help prevent the conductive layer from looking yellow due to color distortion by reducing the transmissive b* value. In an implementation, the tri-functional monomer containing an alkoxy group (e.g., a $C_1$ to $C_5$ alkoxy group) may include at least one of ethoxylated trimethylolpropane tri(meth)acrylate or propoxylated glyceryl tri(meth)acrylate.

The penta-functional monomer or hexa-functional monomer and the tri-functional monomer may be present in a weight ratio of about 2:1 to about 5:1, e.g., about 2:1 to about 3.5:1, in the matrix composition. Within this range, the composition may help improve transmittance and reliability of the transparent conductor 100. Maintaining the content of the tri-functional monomer in an amount that is less than the content of the penta-functional monomer or hexa-functional monomer in the matrix composition may help prevent a problem of deterioration in adhesion to the base layer 110 and in reliability.

The matrix 122 or matrix composition may include an adhesion promoter. The adhesion promoter may help enhance adhesion to a base layer 110 of the metal nanowires 121 while improving reliability of the transparent conductor 100. The adhesion promoter may include, e.g., a silane coupling agent and/or mono-functional monomers to tri-functional monomers. The silane coupling agent may be a suitable silane coupling agent. A silane coupling agent containing an amino group or an epoxy group may help provide good adhesion and chemical resistance. In an implementation, the silane coupling agent may include, e.g., epoxylated silicon compounds such as 3-glycidoxypropyltrimethoxysilane, 3-glycidoxypropylmethyldimethoxysilane, 2-(3,4-epoxycyclohexyl)ethyltrimethoxysilane, and the like; polymerizable unsaturated silicon compounds such as vinyltrimethoxysilane, vinyltriethoxysilane, (meth)acryloxypropyltrimethoxysilane, and the like; amino group-containing silicon compounds such as 3-aminopropyltrimethoxysilane, 3-aminopropyltriethoxysilane, N-(2-aminoethyl)-3-aminopropyltrimethoxysilane, N-(2-aminoethyl)-3-aminopropylmethyldimethoxysilane, and the like; or 3-chloropropyltrimethoxysilane.

The mono-functional monomer to tri-functional monomer may include, e.g., an acid ester-based monomer. In an implementation, the mono- to tri-functional monomer containing a (meth)acrylate group may include at least one of mono- to tri-functional monomers of $C_3$ to $C_{20}$ polyhydric alcohols, e.g., (meth)acrylate, isobornyl(meth)acrylate, cyclopentyl(meth)acrylate, cyclohexyl(meth)acrylate, trimethylolpropane di(meth)acrylate, trimethylolpropane tri(meth)acrylate, pentaerythritol tri(meth)acrylate, tris(2-hydroxyethyl)isocyanuate tri(meth)acrylate, glycerol tri(meth)acrylate, ethylene glycol di(meth)acrylate, neopentyl glycol di(meth)acrylate, hexanediol di(meth)acrylate, or cyclodecane dimethanol di(meth)acrylate. For example, the tri-functional monomer of the adhesion promoter may be different from the other tri-functional monomer of the matrix composition.

The adhesion promoter may be present in the matrix composition in an amount of about 1 wt % to about 15 wt %, e.g., about 5 wt % to about 10 wt %. Within this range, the matrix composition may help improve adhesion while maintaining reliability and conductivity of the transparent conductor.

The matrix 122 or matrix composition may include an antioxidant. The antioxidant may help prevent oxidation of the metal nanowire network of the conductive layer 120. The antioxidant may include, e.g., a mixture of two or more antioxidants. The antioxidant may include, e.g., two or more of triazole-based antioxidants, triazine-based antioxidants, phosphorus-based antioxidants such as a phosphite-based antioxidant and the like, HALS (hindered amine light stabilizer) antioxidants, and phenol-based antioxidants, to help prevent oxidation of the metal nanowires 121 while improving reliability. When two or more antioxidants are used, it is possible to achieve further improved effects in prevention of oxidation and reliability. In an implementation, the antioxidant may include, e.g., a mixture of a phosphorus-based antioxidant and a phenol-based antioxidant, a mixture of a phosphorus-based antioxidant and a HALS-based antioxidant, or a mixture of a phonol-based antioxidant and a HALS-based antioxidant. In an implementation, the antioxidant may include, e.g., a mixture of a phosphorus-based antioxidant and a HALS-based antioxidant, a mixture of a triazole-based antioxidant, a phenol-based antioxidant and a phosphorus-based antioxidant, or a mixture of a triazine-based antioxidant, a phenol-based antioxidant and a phosphorus-based antioxidant. The transparent conductor 100 may help reduce the transmissive b* value without affecting conductivity of the conductive layer 120 by including the phosphorus-based antioxidant.

In an implementation, the phosphorus-based antioxidants may include, e.g., tris(2,4-di-tert-butylphenyl)phosphite; the phenol-based antioxidant may include, e.g., pentaerythritol tetrakis(3-(3,5-di-tert-butyl-4-hydroxyphenyl)propionate); and the HALS-based antioxidants may include, e.g., bis(2,2,6,6-tetramethyl-4-piperidyl)sebacate, bis(2,2,6,6-tetramethyl-4-piperidinyl)sebacate, bis(2,2,6,6-tetramethyl-5-piperidinyl)sebacate, a copolymer of dimethyl succinate and 4-hydroxy-2,2,6,6-tetramethyl-1-piperidine ethanol, or 2,4-bis[N-butyl-n-(1-cyclohexyloxy-2,2,6,6-tetramethylpiperidine-4-yl)amino]-6-(2-hydroxyethylamine)-1,3,5-triazine.

The antioxidant may be present in the matrix composition in an amount of 0.01 wt % to 5 wt %, e.g., 0.5 wt % to 2 wt %. Within this content range of the antioxidant, the matrix composition may help prevent oxidation of the metal nanowires while reducing the transmissive b* value.

The matrix composition may include an initiator. The initiator may be a suitable initiator. In an implementation, the initiator may include α-hydroxy ketone initiators, e.g., 1,1-hydroxycyclohexyl phenyl ketone, or mixtures thereof.

The initiator may be present in the matrix composition in an amount of about 1 wt % to about 15 wt %, e.g., about 2 wt % to about 10 wt %.

The matrix 122 may be formed of or prepared from the matrix composition including the penta-functional monomer or hexa-functional monomer, the tri-functional monomer, the adhesion promoter, the antioxidant, and the initiator. In an implementation, the composition may include, in terms of solid content, e.g., about 50 wt % to about 70 wt % or about 55 wt % to about 66 wt %, of the penta-functional monomer or hexa-functional monomer, about 10 wt % to about 30 wt % or about 15 wt % to about 25 wt %, of the tri-functional monomer, about 1 wt % to about 15 wt % or about 5 wt % to about 10 wt %, of the adhesion promoter, about 0.01 wt % to about 5 wt % or about 0.5 wt % to about 2 wt %, of the antioxidant, and about 1 wt % to about 15 wt % or about 2 wt % to about 10 wt %, of the initiator. Within this range, the composition may help improve transmittance and reliability of the transparent conductor 100 while also preventing the conductive layer 120 from looking yellow due to color distortion.

The matrix 122 or matrix composition may further include additives for performance improvement. The additives may include a UV stabilizer and the like.

The conductive layer 120 may have a thickness of about 10 nm to about 1 μm, e.g., about 20 nm to about 200 nm, about 30 nm to about 130 nm, or about 50 nm to about 100 nm. Within this thickness range of the conductive layer, the transparent conductor 100 may be used as a film for touch panels. Within this range, the transparent conductor may have low contact resistance and improved durability and chemical resistance.

Figure 1B:
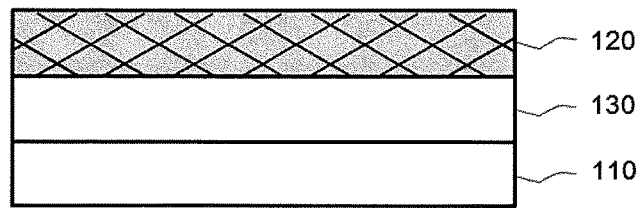
FIG. 1b illustrates a sectional view of a transparent conductor according to an implementation of the one embodiment.
Figure 1C:
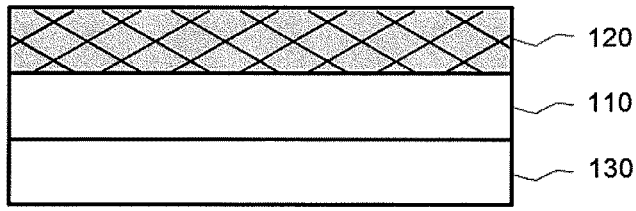
FIG. 1c illustrates a sectional view of a transparent conductor according to an implementation of the one embodiment.
Figure 1D:
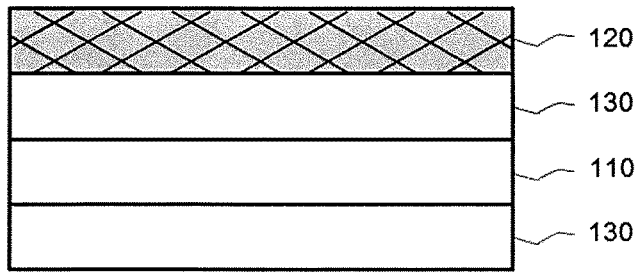
FIG. 1d illustrates a sectional view of a transparent conductor according to an implementation of the one embodiment.

As illustrated in FIGS. 1b to 1d, in an implementation, the transparent conductor 100 may further include a functional layer (130) stacked on one or both surfaces of the base layer 110. The functional layer may include, e.g., a hard coating layer, an anticorrosive layer, an anti-glare coating layer, an adhesion enhancing layer, and/or an oligomer elution preventive layer.

The transparent conductor 100 may have a transmittance of about 90% or higher, e.g., about 90% to about 99%, and a reliability value of about 10% or less, e.g., about 1% to about 10%. Within these ranges, the transparent conductor 100 may have high transmittance and low resistance variation rate, and may be used as a transparent electrode film by patterning the transparent conductor 100. The transparent conductor 100 according to an embodiment may also exhibit suitable properties of a transparent conductor, e.g., durability, chemical resistance, solvent resistance, and the like, due to the matrix 122.

The transparent conductor 100 may exhibit transparency in the wavelength range of visible light, e.g., at a wavelength of about 400 nm to about 700 nm. In an implementation, the transparent conductor 100 may have a haze of about 0% to about 1.3%, e.g., from about 0.01% to about 1.3% (as measured at a wavelength from about 400 nm to about 700 nm using a haze meter), and a total transmittance of about 90% to about 100%, e.g., from about 90% to about 95%. Within this range, the transparent conductor 100 may exhibit good transparency suitable for the transparent conductor. The transparent conductor 100 may have a sheet resistance of about 100Ω/□ or less, e.g., about 50Ω/□ to about 100Ω/□ or about 30Ω/□ to about 100Ω/□, as measured using a 4-probe tester. Within this range, the transparent conductor may be used as a transparent electrode film for touch panels due to low sheet resistance, and may be applied to large-area touch panels.

In an implementation, the transparent conductor 100 may have a thickness of about 10 μm to about 250 μm, e.g., about 50 μm to about 200 μm. Within this range, the transparent conductor may be used as a transparent electrode film including a film for touch panels, and may be used as a transparent electrode film for flexible touch panels. The transparent conductor may be used in film form as a transparent electrode film of touch panels, e-paper, and/or solar cells.

As illustrated in FIG. 1a, the transparent conductor may include the conductive layer 120 including the metal nanowires and the matrix and formed on the upper surface of the base layer 110. In an implementation, a transparent conductor may further includes a conductive layer including metal nanowires and a matrix formed on a lower surface of the base layer.

Next, a transparent conductor according to another embodiment will be described with reference to FIG. 2.

Figure 2:
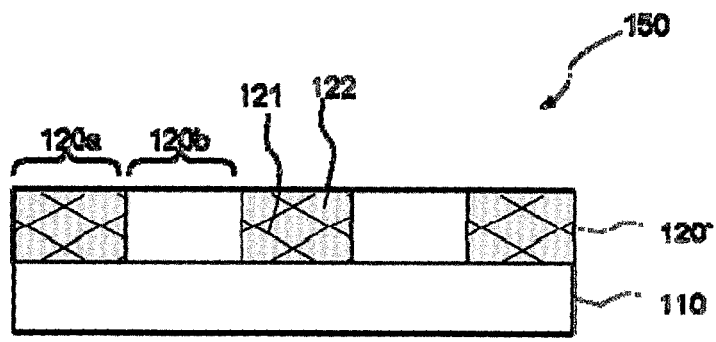
FIG. 2 illustrates a sectional view of a transparent conductor according to another embodiment.

Referring to FIG. 2, a transparent conductor 150 according to another embodiment may include the base layer 110 and a conductive layer 120' on an upper surface of the base layer 110. The conductive layer 120' may include patterns of a metal nanowire-containing conductive layer 120a (which includes metal nanowires 121 and a matrix 122) and a metal nanowire-free conductive layer 120b (which does not include the metal nanowires). The matrix 122 may be formed of or prepared from a matrix composition including one of a penta-functional monomer or a hexa-functional monomer, and may further include a tri-functional monomer, an initiator, an adhesion promoter, and an antioxidant. The transparent conductive layer 150 according to this embodiment may be substantially the same as the transparent conductor 100 according to the above embodiment except that the conductive layer 120' is a patterned conductive layer.

The conductive layer 120' may be patterned by a certain process, e.g., etching using an acid solution. The conductive layer 120' may have a predetermined pattern, x and y channels may be formed thereon, and may be suitable for used in the transparent conductor. For example, the conductive layer 120' may be patterned by or may include metal nanowire-containing conductive layer 120a and the metal nanowire-free conductive layer 120b (which may be composed only of the matrix without the metal nanowires 121), as shown in FIG. 2.

Next, a method for preparing a transparent conductor according to an embodiment will be described.

The method for preparing a transparent conductor according to an embodiment may include, e.g., forming a metal nanowire network layer on a base layer, and coating a matrix composition onto the metal nanowire network layer. The matrix composition may include one of a penta-functional monomer or a hexa-functional monomer, and may further include a tri-functional monomer, an adhesion promoter, an antioxidant, and an initiator. In the method according to this embodiment, the transparent conductor having improved conductivity, optical properties, chemical resistance, and reliability may be obtained by separately coating the matrix composition after coating the metal nanowires, instead of simultaneously coating the metal nanowires and the matrix composition to form the conductive layer.

The metal nanowire composition may be a liquid composition in which the metal nanowires are dispersed, and may include a binder for dispersion of the metal nanowires. For example, the metal nanowire composition may be the same as described in the description of the transparent conductor 100 according to the embodiment described above.

The metal nanowire composition may be coated onto the base layer using a suitable coating method, e.g., bar coating, spin coating, dip coating, roll coating, flow coating, or die coating. The metal nanowires may form the metal nanowire network layer on the base layer by coating the metal nanowires onto the base layer, followed by drying. Drying may be performed, e.g., at about 80° C. to about 140° C. for about 1 minute to about 30 minutes.

The matrix composition may include a binder, an initiator, and a solvent. The matrix composition may be the same as described in the description of the transparent conductor 100 according to the embodiment described above.

The matrix composition may be coated onto the metal nanowire network layer using a suitable coating method, e.g., bar coating, spin coating, dip coating, roll coating, flow coating, or die coating. The metal nanowire network layer may be formed by coating the metal nanowire composition onto a base layer, followed by drying, and the matrix composition coated onto the metal nanowire network layer may permeate the metal nanowire network layer. Thus, the metal nanowires may be impregnated into the matrix composition, thereby forming a conductive layer including the metal nanowires and the matrix. The metal nanowires may be completely impregnated into the matrix, or may be partially exposed to or at a surface of the conductive layer.

The method may further include drying the matrix composition after coating the matrix composition. For example, the matrix composition may be dried at about 80° C. to about 120° C. for about 1 minute to about 30 minutes.

Curing may be performed by at least one of photocuring and thermal curing, after drying. Photocuring may be performed by irradiation of light having a wavelength of about 400 nm or less at an intensity from about 300 mJ/cm$^2$ to about 1,000 mJ/cm$^2$. Thermal curing may include thermal curing performed at about 50° C. to about 200° C. for about 1 hour to about 120 hours.

An apparatus according to an embodiment may include the transparent conductor according to an embodiment. For example, the apparatus may include, e.g., optical displays such as touch panels, touchscreen panels, flexible displays, or the like; e-paper; or solar cells.

Figure 3:
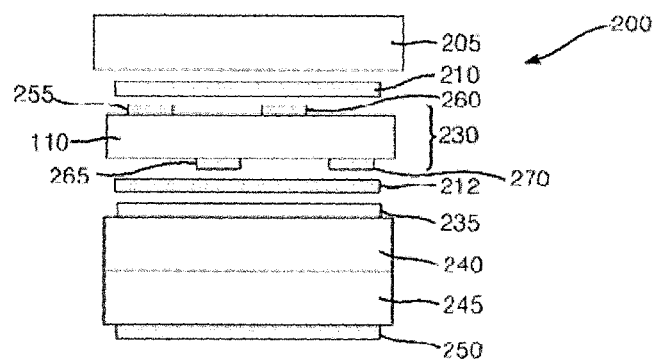
FIG. 3 illustrates a sectional view of an optical display according to one embodiment.
Figure 4:
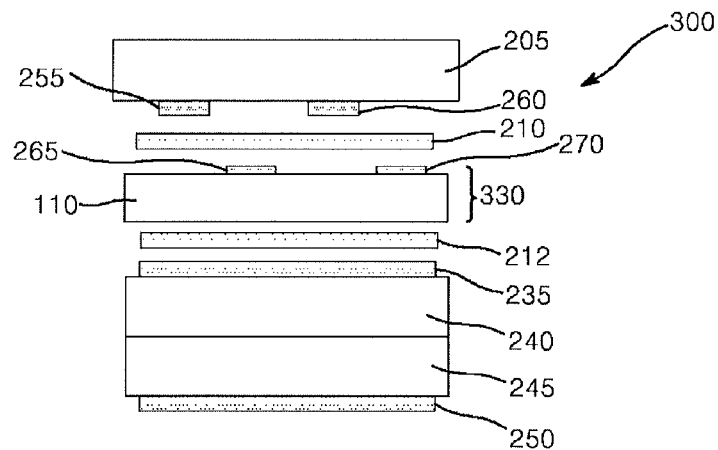
FIG. 4 illustrates a sectional view of an optical display according to another embodiment.
Figure 5:
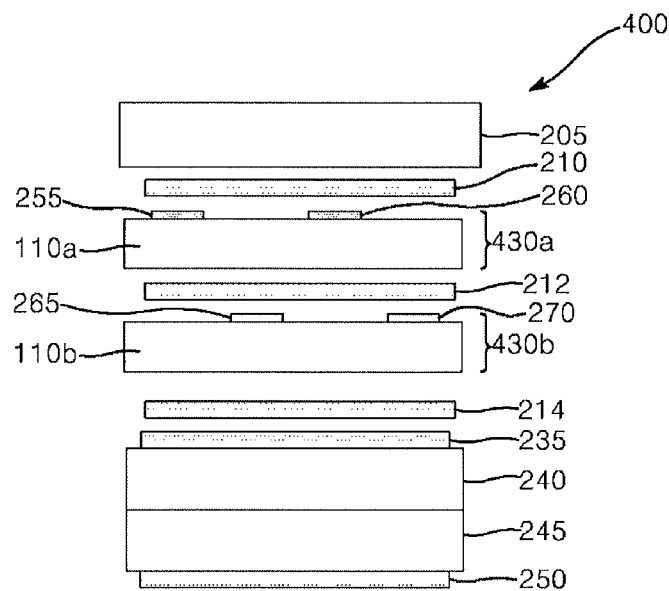
FIG. 5 illustrates a sectional view of an optical display according to another embodiment.

FIGS. 3 to 5 illustrate sectional views of an optical display according to an embodiment.

Referring to FIG. 3, an optical display 200 according to an embodiment may include, e.g., a transparent electrode structure 230 (including the base layer 110, first and second electrodes 255, 260 on an upper surface of the base layer 110, and third and fourth electrodes 265, 270 on a lower surface of the base layer 110); a window glass 205 (above the first and second electrodes 255, 260); a first polarizing plate 235 (below the third and fourth electrodes 265, 270); a color filter (CF) glass 240 (on a lower surface of the first polarizing plate 235); a panel 245 (on a lower surface of the CF glass 240 and including a thin film transistor (TFT) glass); and a second polarizing plate 250 (on a lower surface of the panel 245). In an implementation, the transparent electrode structure 230 may be formed of or prepared using the transparent conductor according to an embodiment.

The transparent electrode structure 230 may be manufactured by forming the first, second, third, and fourth electrodes by patterning the transparent conductor 150 using a predetermined method (e.g., etching or the like). The first and second electrodes 255, 260 may be Rx electrodes, and the third and fourth electrodes 265, 270 may be Tx electrodes, or vice versa. The window glass 205 may perform a screen display function in the optical display and may be formed of a suitable glass material or plastic film. The first and second polarizing plates 235, 250 may impart polarization capabilities to the optical display and may polarize external or internal light. In an implementation, the first and second polarizing plates 235, 250 may include a polarizer or a stacked body of a polarizer and a protective film, and the polarizer and the protective film may include suitable polarizers and protective films, respectively. Adhesive films 210, 212 may be interposed between the window glass 205 and the transparent electrode structure 230 and between the transparent electrode structure 230 and the first polarizing plate 235, respectively, thereby maintaining bonding between the transparent electrode structure 230, the window glass 205 and the first polarizing plate 235. The adhesive films 210, 212 may be suitable adhesive films and may include, e.g., an optically clear adhesive (OCA) film.

In an implementation, the optical display 200 may include a polarizing plate (not illustrated) between the window glass 205 and the transparent electrode structure 230, and the first polarizing plate 235 and the second polarizing plate 250 may be omitted.

Referring to FIG. 4, an optical display 300 according to another embodiment may include, e.g., a transparent electrode structure 330 (including the base layer 110 and third and fourth electrodes 265, 270 on an upper surface of the base layer 110); the window glass 205 (above the third and fourth electrodes 265, 270 and including first and second electrodes 255, 260 on a lower surface thereof); the first polarizing plate 235 (below the transparent electrode structure 330); the color filter (CF) glass 240 (on a lower surface of the first polarizing plate 235); the panel 245 (on a lower surface of the CF glass 240 and including a thin film transistor (TFT) glass); and the second polarizing plate 250 (on a lower surface of the panel 245). Here, the transparent electrode structure 330 may be formed of the transparent conductor according to an embodiment.

The transparent electrode structure 330 may be manufactured by forming the third and fourth electrodes 265, 270 by patterning the transparent conductor using a predetermined method. Here, the first and second electrodes 255, 260 may be formed by a suitable electrode formation method. Adhesive films 210, 212 may be interposed between the window glass 205 and the transparent electrode structure 330 and between the transparent electrode structure 330 and the first polarizing plate 235, respectively, thereby maintaining bonding between the transparent electrode structure, the window glass, and the first polarizing plate.

Referring to FIG. 5, an optical display 400 according to another embodiment may include, e.g., a first transparent electrode structure 430a (including a first base layer 110a, and first and second electrodes 255, 260 on an upper surface of the first base layer 110a); a second transparent electrode structure 430b (below the first transparent electrode structure 430a and including a second base layer 110b and third and fourth electrodes on an upper surface of the second base layer 110b); the first polarizing plate 235 (below the second transparent electrode structure 430b); the color filter (CF) glass 240 (on a lower surface of the first polarizing plate 235); the panel 245 (on a lower surface of the CF glass 240 and including a thin film transistor (TFT) glass); and the second polarizing plate 250 (on a lower surface of the panel 245). Here, the first and second transparent electrode structures 430a, 430b may be formed of the transparent conductor according to the embodiments.

The first and second transparent electrode structures 430a, 430b may be manufactured by forming the first, second, third and fourth electrodes by patterning the transparent conductor using a predetermined method.

Adhesive films 210, 212, 214 may be interposed between the first transparent electrode structure 430a and the window glass 205, between the first and second transparent electrode structures 430a, 430b, and between the second transparent electrode structure 430b and the first polarizing plate 235, respectively, thereby maintaining bonding between the transparent electrode structures, the window glass, and the first polarizing plate. The adhesive films 210, 212, 214 may be suitable adhesive films and may include, e.g., an optically clear adhesive (OCA) film. In an implementation, although not shown in FIGS. 3 to 5, the base layer may have a structure in which resin films are stacked via adhesives and the like.

Hereinafter, the embodiments will be described in more detail with reference to some examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

37 parts by weight of a metal nanowire solution (including 2.45 wt % of a total sum or amount of metal nanowires and a binder, Product name: ClearOhm Ink, Cambrios Co., Ltd.) was added to 63 parts by weight of ultrapure distilled water, followed by stirring, thereby preparing a metal nanowire composition. Then, 65.4 parts by weight of dipentaerythritol hexaacrylate (SK Cytec Co., Ltd.), 20.8 parts by weight of ethoxylated trimethylolpropane triacrylate (Sartomer Co., Ltd.), 0.9 parts by weight of a mixture of a phenol-based antioxidant Irganox 1010 (BASF) and a phosphorus-based antioxidant Irgafos 168 (BASF), 8.6 parts by weight of an adhesion promoter KBE-903 (Shin-Etsu Co., Ltd.), 4.3 parts by weight of an initiator Irgacure 184 (Ciba Co., Ltd.) were mixed to prepare 100 parts by weight of a mixture. Then, 1 part by weight of the mixture was added to 49.5 parts by weight of isopropyl alcohol and 49.5 parts by weight of propylene glycol monomethyl ether acetate to prepare a matrix composition.

The metal nanowire composition was coated onto a polycarbonate film (thickness: 50 μm, Teijin Co., Ltd.) using a spin coater, followed by drying in an oven at 80° C. for 2 minutes. Next, the matrix composition was coated onto the metal nanowire layer using a spin coater to form a conductive layer to a thickness of 85 nm, followed by drying in an oven at 80° C. for 2 minutes, and then subjected to UV curing at 300 mJ/cm$^2$, thereby preparing a transparent conductor.

Example 2

A transparent conductor was prepared in the same manner as in Example 1 except that 20.8 parts by weight of propoxylated glycerol triacrylate (Sartomer Co., Ltd.) was used instead of 20.8 parts by weight of ethoxylated trimethylolpropane triacrylate.

Example 3

A transparent conductor was prepared in the same manner as in Example 1 except that 20.8 parts by weight of trimethylolpropane triacrylate (SK Cytec Co., Ltd.) was used instead of 20.8 parts by weight of ethoxylated trimethylolpropane triacrylate.

Example 4

A transparent conductor was prepared in the same manner as in Example 1 except that 65.4 parts by weight of dipentaerythritol pentaacrylate (Sartomer Co., Ltd.) was used instead of 65.4 parts by weight of dipentaerythritol hexaacrylate (SK Cytec Co., Ltd.).

Example 5

A transparent conductor was prepared in the same manner as in Example 1 except that 0.9 parts by weight of a mixture of an HALS-based antioxidant TINUVIN 152 (BASF) and a phenol-based antioxidant Irganox 1010 was used.

Example 6

A transparent conductor was prepared in the same manner as in Example 1 except that 0.9 parts by weight of a mixture of a triazole-based antioxidant BTA (benzotriazole, Daejung Chemicals & Materials Co., Ltd.), a phenol-based antioxidant Irganox 1010, and a phosphorus-based antioxidant Irgafos 168 (BASF) was used.

Example 7

A transparent conductor was prepared in the same manner as in Example 1 except that 0.9 parts by weight of a mixture of an HALS-based antioxidant TINUVIN 152 (BASF) and a phosphorus-based antioxidant Irgafos 168 (BASF) was used.

Comparative Example 1

A transparent conductor was prepared in the same manner as in Example 1 except that the matrix composition was not coated.

Comparative Example 2

A transparent conductor was prepared in the same manner as in Example 1 except that 20.8 parts by weight of glycerol dimethacrylate (TCI) was used instead of 20.8 parts by weight of ethoxylated trimethylolpropane triacrylate.

Comparative Example 3

A transparent conductor was prepared in the same manner as in Example 1 except that 65.4 parts by weight of 2-ethylhexyl acrylate was used instead of 65.4 parts by weight of dipentaerythritol hexaacrylate.

Comparative Example 4

A transparent conductor was prepared in the same manner as in Example 1 except that 86.2 parts by weight of dipentaerythritol hexaacrylate and 0 parts by weight of ethoxylated trimethylolpropane triacrylate were used (e.g., the triacrylate was admitted).

Comparative Example 5

A transparent conductor was prepared in the same manner as in Example 1 except that 0 parts by weight of dipentaerythritol hexaacrylate and 86.2 parts by weight of ethoxylated trimethylolpropane triacrylate were used (e.g., the hexaacrylate was omitted).

Comparative Example 6

A transparent conductor was prepared in the same manner as in Example 1 except that a mixture of the metal nanowire composition and the matrix composition was coated onto a polycarbonate film.

Each of the transparent conductors prepared in the Examples and Comparative Examples was evaluated as to the following properties. Results are shown in Table 1, below.

(1) Sheet resistance (Ω/□): Sheet resistance on a surface of the transparent conductor (not subjected to patterning) was measured using a contact-type sheet resistance meter (R-CHEK RC2175, EDTM Co., Ltd.).

(2) Haze and Total transmittance (%): The transparent conductive film of the transparent conductor was placed to face a light source, followed by measuring haze and total transmittance at a wavelength of 400 nm to 700 nm using a haze meter (NDH-9000).

(3) Transmissive b* value: Transmissive color coordinates were measured on the transparent conductors prepared in the Examples and Comparative Examples (Thickness of polycarbonate film: 50 μm, Thickness of conductive layer including metal nanowires and matrix: 85 nm) at a wavelength of 400 nm to 700 nm using a UV spectrometer (Illuminant 65 degrees, Observer 2 degrees) CM6000D (Konica Minolta Co., Ltd.).

(4) Reliability: Reliability was measured by means of resistance variation rate. With a 125 μm thick transparent adhesive film (Optically Clear Adhesives 8215, 3M) and a 100 μm thick PET film (A4300, Toyobo) sequentially stacked on each of the transparent conductive layers prepared in the Examples and Comparative Examples (Thickness of polycarbonate film: 50 μm, Thickness of conductive layer including metal nanowires and matrix: 85 nm), initial sheet resistance (a) of the stacked structure was measured in the same manner as in (1), and left under conditions of 85° C. and 85% RH for 240 hours, followed by measuring sheet resistance (b) in the same manner. Then, the resistance variation rate was calculated by Equation: |b−a|/a×100.

(5) IPA rubbing: Isopropanol was sprayed onto the conductive layer and rubbed 10 times using a wiper, followed by observation of variation in external appearance and resistance. When there was no variation in external appearance by the naked eye and the resistance variation rate was 10% or less, the sample was rated as "good", and when there was variation in external appearance and/or the resistance variation rate exceeded 10%, the sample was rated as "poor".

(6) Cross-cut testing: Each of the conductive layers prepared in the Examples and Comparative Examples was scratched using a knife to form 100 cells each having a size of 10 mm×10 mm, and attachment and detachment of a tape (Scotch Magic Tape, 3M Company) was repeated twice with respect to the scratched conductive layer to evaluate adhesion of the conductive layer to a substrate based on the number of cells separated from the conductive layer. Tables 1 and 2, below, show the number of cells remaining on the conductive layer.

TABLE 1

| (Unit: Parts by weight) | Example 1 | Example 2 | Example 3 | Example 4 | Example 5 | Example 6 | Example 7 |
|---|---|---|---|---|---|---|---|
| Dipentaerythritol hexaacrylate | 65.4 | 65.4 | 65.4 | — | 65.4 | 65.4 | 65.4 |
| Dipentaerythritol pentaacrylate | — | — | — | 65.4 | — | — | — |
| Ethoxylated trimethylolpropane triacrylate | 20.8 | — | — | 20.8 | 20.8 | 20.8 | 20.8 |

TABLE 1-continued

| (Unit: Parts by weight) | Example 1 | Example 2 | Example 3 | Example 4 | Example 5 | Example 6 | Example 7 |
|---|---|---|---|---|---|---|---|
| Propoxylated glycerol triacrylate | — | 20.8 | — | — | — | — | — |
| Trimethylolpropane trimethacrylate | — | — | 20.8 | — | — | — | — |
| Irganox 1010 | 0.5 | 0.5 | 0.5 | 0.5 | 0.5 | 0.3 | — |
| Irgafos 168 | 0.4 | 0.4 | 0.4 | 0.4 | — | 0.3 | 0.5 |
| TINUVIN 152 | — | — | — | — | 0.4 | — | 0.4 |
| Benzotriazole | — | — | — | — | — | 0.3 | — |
| Adhesion promoter | 8.6 | 8.6 | 8.6 | 8.6 | 8.6 | 8.6 | 8.6 |
| Initiator | 4.3 | 4.3 | 4.3 | 4.3 | 4.3 | 4.3 | 4.3 |
| Haze (%) | 1.07 | 1.08 | 1.09 | 1.06 | 1.02 | 1.09 | 1.09 |
| Total transmittance (%) | 90.12 | 90.39 | 90.10 | 90.46 | 90.25 | 90.21 | 90.12 |
| Sheet resistance (Ω/□) | 47.02 | 47.34 | 47.40 | 47.10 | 48.12 | 48.61 | 48.06 |
| Transmissive b* | 1.10 | 1.13 | 1.17 | 1.10 | 1.09 | 1.08 | 1.07 |
| IPA rubbing | good | good | good | good | good | good | good |
| Cross-cut | 100/100 | 100/100 | 100/100 | 100/100 | 100/100 | 100/100 | 100/100 |
| Reliability (%) | 4 | 5 | 4 | 4 | 2 | 3 | 3 |

TABLE 2

| (Unit: parts by weight) | Comparative Example 1 | Comparative Example 2 | Comparative Example 3 | Comparative Example 4 | Comparative Example 5 | Comparative Example 6 |
|---|---|---|---|---|---|---|
| Dipentaerythritol hexaacrylate | — | 65.4 | — | 86.2 | — | 65.4 |
| Ethoxylated trimethylolpropane triacrylate | — | — | 20.8 | — | 86.2 | 20.8 |
| Glycerol dimethacrylate | — | 20.8 | — | — | — | — |
| 2-ethylhexyl acrylate | — | — | 65.4 | — | — | — |
| Irganox 1010 | — | 0.5 | 0.5 | 0.5 | 0.5 | 0.5 |
| Irgafos 168 | — | 0.4 | 0.4 | 0.4 | 0.4 | 0.4 |
| TINUVIN 152 | — | — | — | — | — | — |
| Adhesion promoter | — | 8.6 | 8.6 | 8.6 | 8.6 | 8.6 |
| Initiator | — | 4.3 | 4.3 | 4.3 | 4.3 | 4.3 |
| Haze (%) | 1.03 | 1.12 | 1.49 | 1.29 | 1.54 | 0.9 |
| Total transmittance (%) | 88.17 | 90.05 | 89.77 | 90.13 | 90.3 | 88.98 |
| Sheet resistance (Ω/□) | 50.1 | 50.7 | 57.91 | 54.41 | 53.92 | 749.8 |
| Transmissive b* | 0.86 | 1.31 | 1.54 | 1.21 | 1.12 | 0.94 |
| IPA rubbing | poor | poor | poor | good | poor | poor |
| Cross-cut | 0/100 | 50/100 | 50/100 | 100/100 | 50/100 | 0/100 |
| Reliability (%) | 300 | 22 | 29 | 18 | 52 | 129 |

As shown in Table 1, it may be seen that the transparent conductors of Examples 1 to 7 may help prevent color distortion of the conductive layer by securing high transmittance, high reliability and low transmissive b*, and exhibited good chemical resistance and adhesion due to less change in resistance variation rate and external appearance upon IPA rubbing.

Conversely, the transparent conductor of Comparative Example 1, which did not include the matrix, had a transmittance of less than 90%, and low adhesion and durability. The transparent conductor of Comparative Example 2, which employed a bi-functional monomer instead of the tri-functional monomer, exhibited insufficient adhesion and chemical resistance upon IPA rubbing and cross-cut testing. The transparent conductor of Comparative Example 3, which employed a bi-functional monomer instead of the hexa-functional monomer, exhibited poor adhesion and durability due to insufficient improvement in optical properties. The transparent conductors of Comparative Examples 4 and 5, which did not employ one of the hexa-functional monomer and the tri-functional monomer, exhibited insufficient characteristics in terms of optical properties, adhesion, and durability. The transparent conductor of Comparative Example 6, which was formed by simultaneously coating the metal nanowire composition and the matrix composition, suffered from an increase in sheet resistance, a deterioration in optical properties, and poor external appearance of the coating film.

By way of summation and review, transparent conductors including silver nanowires may include an overcoat layer for improvement of adhesion to a substrate However, overcoat layers used for the transparent conductors may have a high transmissive b* value among color difference coefficients, and the transparent conductors may suffer from color distortion and deterioration of optical properties such as transmittance, haze, or the like. A transparent conductive layer containing silver nanowires may look yellow due to the silver nanowires.

The embodiments may provide a transparent conductor that exhibits good optical properties, e.g., transmittance, haze, or the like, by reducing a transmissive b* value.

The embodiments may provide a transparent conductor that exhibits good optical properties and has low sheet resistance while securing good reliability and durability.

Thus, the embodiments may provide transparent conductors that exhibit good optical properties including transmittance, haze, or the like, have low sheet resistance, and secure good reliability and durability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A transparent conductor, comprising:
   a base layer; and
   a conductive layer on the base layer, the conductive layer including metal nanowires and a matrix,
   wherein:
   the transparent conductor has a transmissive b* value of about 1.5 or less, and
   the matrix is prepared from a matrix composition including a tri-functional monomer and one of a penta-functional monomer or a hexa-functional monomer, a weight ratio of the penta-functional monomer or a hexa-functional monomer to the tri-functional monomer in the matrix composition being about 2:1 to about 5:1.

2. The transparent conductor as claimed in claim 1, wherein the tri-functional monomer includes a (meth)acrylate-based monomer.

3. The transparent conductor as claimed in claim 1, wherein the tri-functional monomer includes a (meth)acrylate-based monomer modified with an alkoxy group.

4. The transparent conductor as claimed in claim 1, wherein the transparent conductor has a resistance variation rate of about 10% or less, as represented by the following equation:

Resistance variation rate=|b−a|/a×100, wherein, "a" represents an initial sheet resistance of a sample formed by stacking a 125 μm thick transparent adhesive film and a 100 μm thick PET film sequentially on the transparent conductor, and "b" represents a sheet resistance of the sample after being left under conditions of 85° C. and 85% RH for 240 hours.

5. The transparent conductor as claimed in claim 1, wherein the matrix composition further includes at least one of an initiator, an adhesion promoter, or an antioxidant.

6. The transparent conductor as claimed in claim 5, wherein:
   the matrix composition includes the adhesion promoter, and
   the adhesion promoter is present in the matrix composition in an amount of about 1 wt % to about 15 wt %, in terms of solid content.

7. The transparent conductor as claimed in claim 5, wherein:
   the matrix composition includes the antioxidant, and
   the antioxidant is present in the matrix composition in an amount of about 0.01 wt % to about 5 wt %, in terms of solid content.

8. The transparent conductor as claimed in claim 5, wherein the matrix composition includes:
   about 50 wt % to about 70 wt % of the hexa-functional monomer or the penta-functional monomer,
   about 10 wt % to about 30 wt % of the tri-functional monomer,
   about 1 wt % to about 15 wt % of the initiator,
   about 1 wt % to about 15 wt % of the adhesion promoter, and
   about 0.01 wt % to about 5 wt % of the antioxidant, all amounts being in terms of solid content.

9. The transparent conductor as claimed in claim 5, wherein:
   the matrix composition includes the adhesion promoter, and
   the adhesion promoter includes at least one of a silane coupling agent or a bi-functional monomer.

10. The transparent conductor as claimed in claim 5, wherein:
    the matrix composition includes the antioxidant, and
    the antioxidant includes a hindered amine light stabilizer (HALS)-based antioxidant and a phosphorus-based antioxidant.

11. The transparent conductor as claimed in claim 5, wherein:
    the matrix composition includes the antioxidant, and
    the antioxidant includes a triazole-based antioxidant, a phenol-based antioxidant, and a phosphorus-based antioxidant.

12. The transparent conductor as claimed in claim 5, wherein:
    the matrix composition includes the antioxidant, and
    the antioxidant includes a triazine-based antioxidant, a phenol-based antioxidant, and a phosphorus-based antioxidant.

13. The transparent conductor as claimed in claim 1, wherein the metal nanowires include silver nanowires.

14. The transparent conductor as claimed in claim 1, further comprising, on an upper or lower surface of the base layer, at least one of a hard coating layer, an anticorrosive layer, an anti-glare coating layer, an adhesion enhancing layer, or an oligomer elution preventive layer.

15. The transparent conductor as claimed in claim 1, wherein the conductive layer is a patterned conductive layer.

16. An optical display comprising the transparent conductor as claimed in claim 1.

17. The transparent conductor as claimed in claim 1, wherein the transparent conductor has a transmissive b* value of about 0.5 to about 1.5.

18. A method for preparing the transparent conductor as claimed in claim 1, the method comprising:
    forming a metal nanowire network layer on the base layer; and
    forming the conductive layer on the metal nanowire network layer using the matrix composition, the matrix composition including the tri-functional monomer, an adhesion promoter, an antioxidant, an initiator, and the one of a penta-functional monomer or a hexa-functional monomer.

19. A transparent conductor, comprising:
    a base layer; and
    a conductive layer on the base layer, the conductive layer including metal nanowires and a matrix,
    wherein:
    the transparent conductor has a transmissive b* value of about 1.5 or less,
    the matrix is prepared from a matrix composition including a tri-functional monomer and one of a penta-functional monomer or a hexa-functional monomer, and
    the matrix composition includes:
    about 50 wt % to about 70 wt % of the hexa-functional monomer or the penta-functional monomer, about 10 wt % to about 30 wt % of the tri-functional monomer,
about 1 wt % to about 15 wt % of an initiator,
about 1 wt % to about 15 wt % of an adhesion promoter, and
about 0.01 wt % to about 5 wt % of an antioxidant, all amounts being in terms of solid content.

* * * * *